United States Patent
Kumar et al.

(10) Patent No.: US 7,924,056 B2
(45) Date of Patent: Apr. 12, 2011

(54) LOW VOLTAGE DIFFERENTIAL SIGNALLING DRIVER

(75) Inventors: Nidhir Kumar, Bangalore (IN);
Sandeep Dwivedi, Bangalore (IN);
Tippana Hari Babu, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/453,889

(22) Filed: May 26, 2009

(65) Prior Publication Data
US 2010/0231268 A1 Sep. 16, 2010

(30) Foreign Application Priority Data
Mar. 13, 2009 (IN) .............................. 491/DEL/2009

(51) Int. Cl.
*H03K 19/08* (2006.01)
(52) U.S. Cl. ............ 326/83; 326/86; 326/115; 326/120; 327/83; 327/108; 327/209; 327/309; 330/252; 330/253; 330/255
(58) Field of Classification Search ................... 330/253, 330/260, 261, 285, 296; 327/83, 108–112, 327/209, 309, 541, 560, 561; 326/83, 86, 326/115, 120
See application file for complete search history.

(56) References Cited

U.S. PATENT DOCUMENTS

| | | | | |
|---|---|---|---|---|
| 5,883,535 A * | 3/1999 | Kato | | 327/170 |
| 5,942,940 A * | 8/1999 | Dreps et al. | | 330/253 |
| 6,392,485 B1 * | 5/2002 | Doi et al. | | 330/253 |
| 6,411,126 B1 * | 6/2002 | Tinsley et al. | | 326/83 |
| 7,034,574 B1 * | 4/2006 | Li | | 326/83 |
| 7,342,450 B2 * | 3/2008 | Jones | | 330/253 |
| 7,548,114 B2 * | 6/2009 | Yu | | 330/255 |
| 7,548,117 B2 * | 6/2009 | Zhang et al. | | 330/292 |
| 7,586,373 B2 * | 9/2009 | Kim | | 330/257 |
| 7,652,533 B2 * | 1/2010 | Wang et al. | | 330/253 |
| 7,808,486 B2 * | 10/2010 | Griffin | | 345/168 |
| 2002/0158691 A1 * | 10/2002 | Blankenship et al. | | 330/253 |
| 2003/0122593 A1 * | 7/2003 | Volk | | 327/108 |

* cited by examiner

*Primary Examiner* — Linh V Nguyen
(74) *Attorney, Agent, or Firm* — Nixon & Vanderhye P.C.

(57) ABSTRACT

A low voltage differential signalling driver is provided in which a first output node and a second output node provide a differential signal. First differential steering switch circuitry is switched in dependence on a differential input signal to selectively connect the first output node to a voltage supply via a current source, while second differential steering circuitry is switched in dependence on an inverse version of the differential input signal to connect the second output node to the voltage supply via the current source. Slew control circuitry is provided, configured to establish a current discharge path for the current source during the polarity transition of the differential input signal, thus maintaining a symmetric slew rate of the output signals at the first output node and second output node.

15 Claims, 10 Drawing Sheets

LOW VOLTAGE DIFFERENTIAL SIGNALLING DRIVER

BACKGROUND OF THE INVENTION

1. Field of the Invention

The present invention relates to differential signalling drivers. More particularly, this invention relates to differential signalling drivers operating at low voltages.

2. Description of the Prior Art

Differential signalling drivers are known in the art. FIG. 1 illustrates a conventional low voltage differential signalling (LVDS) driver 100. The LVDS driver is situated between a voltage supply (DVDD) 110 and ground 115. A first current source (I1) 120 connects the LVDS driver to the voltage supply DVDD 110 and a second current source (I2) 130 connects the LVDS driver to ground 115. The LVDS driver has two output nodes (also known as pads) PADP and PADN. A differential signalling line (not illustrated) has one of its paths connected to PADP and its other path connected to PADN. It is the voltage difference between PADP and PADN which defines the differential signal. PADP and PADN are connected by resistors 141 and 142. The mid-point of these two resistors defines the common mode voltage (VCM) of the LVDS driver at point 150.

The LVDS driver further comprises four switches PDP, NDN, PDN and NDP. These switches are ganged together such that PDP and NDN are switched together and PDN and NDP are switched together. Hence, in order to create a voltage differential between PADP and PADN, in a first phase switches PDP and NDN are closed whilst switches PDN and NDP are open. In this configuration, the voltage at PADP will rise and the voltage at PADN will fall. In order to invert the differential signal the pair of switches PDP and NDN are opened and the pair of switches PDN and NDP are closed. In this configuration the voltage at PADP falls and the voltage at PADN rises. Because of the switching configuration set out above, typically PDP and NDN are switched in dependence on the same switching signal, and similarly PDN and NDP are switched in dependence on the inverse of that switching signal. LVDS drivers such as that illustrated in FIG. 1 typically operate with a voltage supply of 2.5V or above.

FIG. 2 illustrates a LVDS driver system, in which a LVDS driver 200 is controlled by voltage level shifter circuitry 210 and pre-driver circuitry 220. A data signal that is desired to be transmitted by the LVDS driver is input into the voltage level shifter circuitry 210, which transforms the data signal into a suitable voltage level signal for input into pre-driver circuitry 220. Pre-driver circuitry 220 then generates the necessary switching signals for controlling the LVDS driver 200. In particular, the pre-driver circuitry 220 generates a signal on line 230 to control switch PDP (abbreviated as 'signal PDP' in the following), a signal on line 232 to control switch PDN (abbreviated as 'signal PDN' in the following), a signal on line 234 to control switch NDP (abbreviated as 'signal NDP' in the following) and a signal on line 236 to control switch NDN (abbreviated as 'signal NDN' in the following). As set out with reference to FIG. 1, the signals on lines 230 and 236 are typically one and the same signal, and the signals on lines 232 and 234 are typically the inverse of that signal. In the example illustrated in FIG. 2, switches PDP and PDN are PMOS transistors and switches NDP and NDN are NMOS transistors. External connections 240 and 245 connect to pads PADP and PADN respectively. Electrostatic discharge (ESD) circuitry is also provided, connected to pads PADP and PADN. The current source I1 is implemented by a PMOS transistor biased by predetermined voltage level BIASP and current source I2 is provided by an NMOS transistor biased by predetermined voltage level BIASN.

With the drive towards lower power consumption devices, it would be desirable to operate such a LVDS driver system at even lower supply voltage, for example at 1.8V rather than the conventional 2.5V. However, operating at 1.8V can be problematic, in particular when the LVDS driver is being switched at high frequencies. The problems occur because the common mode voltage (VCM) is allowed, according to the LVDS driver definition, to vary between 1.125V and 1.375V. When the VCM voltage drifts upwards, this results (when using a 1.8V supply) in a limited voltage across current source I1. In the worst case scenario this can be as little as 150 mV. This reduced voltage "headroom" in the current source I1 results in a lower output impedance of this current source. The voltage across current source I1 varies with the data signal and hence the current source I1 will give a greater current variation due to its lower output impedance. A greater current conducted by current source I1 in this situation has the effect that the time taken to charge one of the pads PADP or PADN is reduced with respect to the time taken to discharge the opposite pad (PADN or PADP respectively). Since the pads PADP and PADN then charge faster than they discharge, the slew rate is faster when rising than when falling. This asymmetric slew rate can be a significant problem for signal integrity as the differential nature of the differential signal is not fully respected.

This asymmetric slew is illustrated in FIG. 3, in which the time evolution of the differential signal generated by pads PADP and PADN can be seen. It can clearly be seen that there is a faster rise slew than fall slew. It will be appreciated that whilst the differential signal is reliable when the voltages at PADP and PADN are not changing, problems may arise if these signals are sampled nearer to the transition region.

Some of the problems associated with low voltage low power LVDS drivers are discussed in the article "Low Power Low Voltage LVDS Drivers" by Chen, Martinez, Nix and Robinson, IEEE JSSC Volume 40, No. 2, February 2005 and in the related U.S. Pat. No. 6,927,608.

One alternative implementation of a LVDS driver 400 discussed in the Chen et al. article is illustrated in FIG. 4. This LVDS driver differs from that illustrated in FIG. 1 by the provision of parallel current sources 420 and 430 on the voltage supply side. Voltage supply (DVDD) 410 is the same as the DVDD supply 110 in FIG. 1. A single further current source 440 connects the LVDS driver to ground 450. This LVDS driver has the advantage that it does not suffer from the asymmetric slew problem described above, yet the provision of double current sources results in double the static current consumption.

The solutions proposed by Chen et al., which involve switchable current sources, are limited in terms of the frequency of differential signal that they can transmit, due to limitations on the speed at which the current sources can be switched. Furthermore, these solutions add undesirable jitter to the system.

Feedback mechanisms to increase the output impedance of a current source are also known (such as a regulated cascode current mirror), yet these techniques do not allow fast enough switching for use in LVDS drivers such as are discussed above.

It would be desirable to provide an improved technique for low voltage differential signalling which does not suffer from an asymmetric slew rate, without resorting to parallel current sources and their consequent doubling of static current consumption.

SUMMARY OF THE INVENTION

Viewed from a first aspect, the present invention provides a low voltage differential signalling driver comprising: a current source, said current source being connected to a voltage supply; a first output node and a second output node for providing a differential signal by virtue of a difference between a first voltage of said first output node and a second voltage of said second output node; first differential steering switch circuitry configured to be switched in dependence on a differential input signal to selectively connect said current source to said first output node to cause said first voltage to rise with respect to said second voltage; second differential steering switch circuitry configured to be switched in dependence on an inverse version of said differential input signal to selectively connect said current source to said second output node to cause said second voltage to rise with respect to said first voltage; and slew control circuitry configured to, during a polarity transition of said differential input signal, establish a current discharge path for said current source.

The inventors of the present invention realised that it is not necessary to provide parallel current sources at the voltage supply side in order to address the asymmetric slew problem. Instead, slew control circuitry is provided which is configured, during a polarity transition of the differential input signal, to establish a current discharge path for the current source. Hence, in the period when a pad is charging up, the temporary provision of an additional current discharge path for the current source drains away some of the "extra" current that would otherwise be drawn through the current source connected to the voltage supply. This slows the rate at which the charging pad charges up and restores the symmetry of the slew rates of the LVDS driver.

It will be appreciated that the current discharge path could temporarily connect the current source to a range of reference voltages, but in one embodiment the slew control circuitry is configured to establish said current discharge path for said current source by connecting said current source to ground.

In one embodiment, said first differential steering switch circuitry further selectively connects said second output node to a reference voltage to cause said second voltage to fall whilst said first voltage is rising, and said second differential steering switch circuitry selectively connects said first output node to said reference voltage to cause said first voltage to fall whilst said second voltage is rising. This arrangement provides a balanced switching configuration for the LVDS driver such that the rising output node is connected to the voltage supply and the falling output node is connected to the reference voltage.

It will be appreciated that this reference voltage could take a range of values but in one embodiment the reference voltage is ground. In one embodiment the LVDS driver further comprises a further current source, said further current source connecting said first output node and said second output node to ground. This further current source helps maintain the correct common mode voltage between the first output node and a second output node, and further helps to reject ground noise.

In one embodiment the slew control circuitry is configured to establish said current discharge path in dependence on a pulsed signal. A pulsed signal provides a convenient mechanism for signalling when the slew control circuitry should establish the current discharge path for the current source.

The pulsed signal could be generated in a variety of ways but in one embodiment the pulsed signal is generated from the differential input signal. This results in an advantageous synchronisation between the differential input signal and the switching of the slew control circuitry.

There are a variety of ways in which the pulsed signal could be generated from the differential input signal, but in one embodiment a first pulse signal is generated from an inverse version of said differential input signal and a delayed version of said differential input signal, a second pulse signal is generated from said differential input signal and a delayed version of said inverse version of said differential input signal, and said pulsed signal is generated by interleaving said first pulse signal and said second pulse signal. The combination of an inverse version of the differential input signal and delayed version of the differential input signal results in a pulse generated immediately following a rising polarity transition of the inverse version of the differential input signal. Similarly the pulse signal generated from the differential input signal and delayed version of the inverse version of the differential input signal results in a pulse immediately following a rising transition of the differential input signal. Interleaving these two pulsed signals conveniently provides a pulse that immediately follows each polarity transition of the differential input signal.

The delayed version of the differential input signal and the delayed version of the inverse version of the differential input signal could be generated in a variety of ways, but in one embodiment said delayed version of said differential input signal is generated by buffering said differential input signal, and said delayed version of said inverse version of said differential input signal is generated by buffering said inverse version of said differential input signal.

In one embodiment the slew control circuitry comprises an NMOS transistor switched by said pulse signal to selectively establish said current discharge path. In a further embodiment the slew control circuitry further comprises a PMOS transistor switched by an inverse version of the pulsed signal.

Viewed from a second aspect, the present invention provides a method of providing a low voltage differential signal comprising the steps of: providing a current source connected to a voltage supply; providing a first output node and a second output node, said first output node and said second output node being for providing a differential signal by virtue of a difference between a first voltage of said first output node and a second voltage of said second output node; connecting said current source to said first output node in dependence on a differential input signal to cause said first voltage to rise with respect to said second voltage; connecting said current source to said second output node in dependence on an inverse version of said differential input signal to cause said second voltage to rise with respect to said first voltage; and during a polarity transition of said differential input signal, establishing with slew control circuitry a current discharge path for said current source.

Viewed from a third aspect, the present invention provides a low voltage differential signalling driver comprising: a current source means, said current source means being connected to a voltage supply; a first output node means and a second output node means for providing a differential signal by virtue of a difference between a first voltage of said first output node means and a second voltage of said second output node means; first differential steering switch means configured to be switched in dependence on a differential input signal to selectively connect said current source means to said first output node means to cause said first voltage to rise with respect to said second voltage; second differential steering switch means configured to be switched in dependence on an inverse version of said differential input signal to selectively connect said current source means to said second output node to cause said second voltage to rise with respect to said first voltage; and slew control means for, during a polarity transition of said differential input signal, establishing a current discharge path for said current source means.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 5:
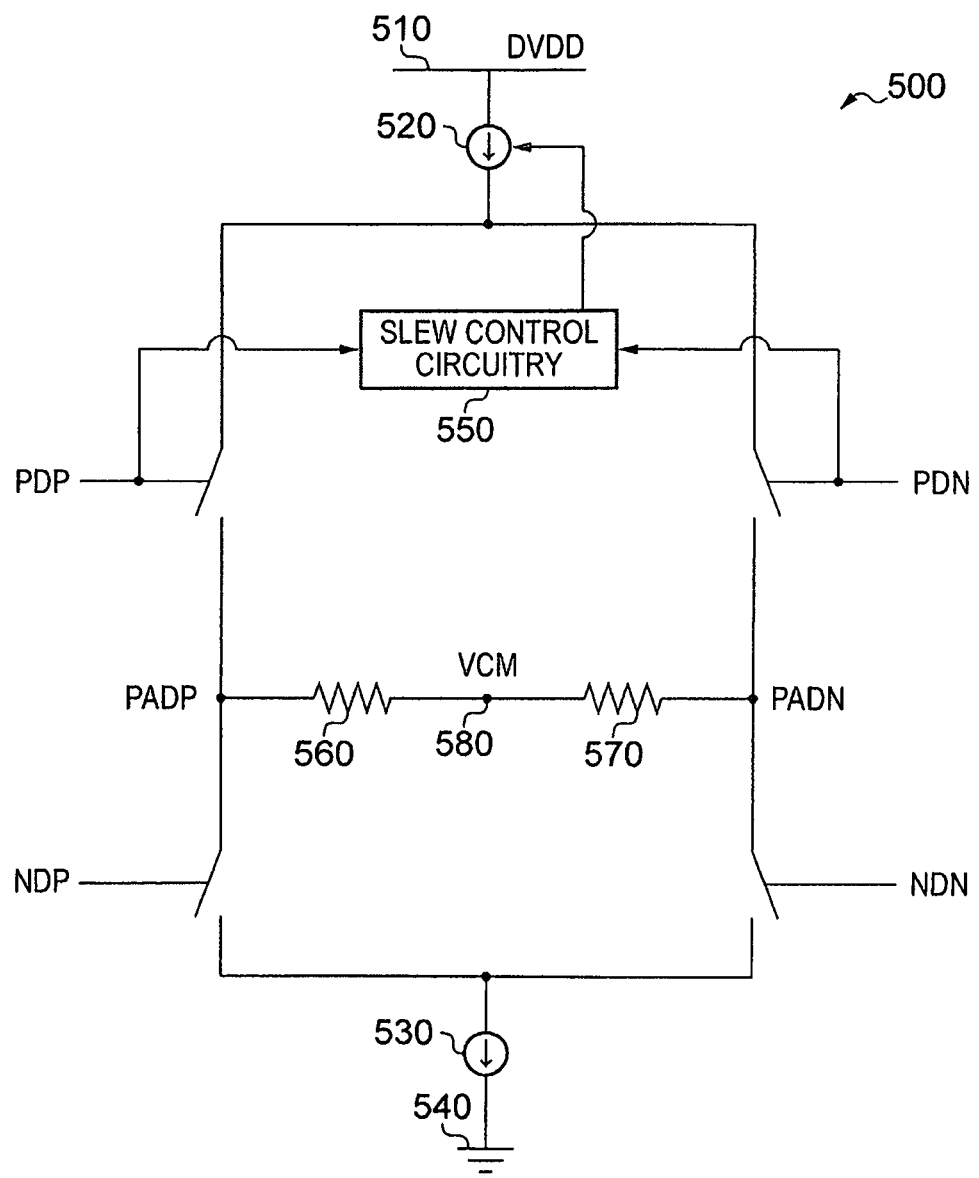
FIG. 5 schematically illustrates a LVDS driver according to one embodiment of the present invention.

FIG. 5 schematically illustrates a LVDS driver 500 according to one embodiment of the present invention. Digital voltage supply (DVDD) 510 provides a 1.8V voltage supply. The LVDS driver is connected to the voltage supply 510 via current source 520. In this embodiment current source 520 is implemented by a PMOS transistor. A first output node PADP and second output node PADN provide a differential signal by virtue of a difference between their respective voltages. Resistors 560 and 570 connect PADP to PADN via common mode voltage (VCM) point 580. The VCM is allowed to vary in the range 1.125V-1.375V. The voltages at pads (output nodes) PADP and PADN are controlled by switches PDP, NDN, PDN and NDP. Switches PDP and NDN are switched together whilst switches PDN and NDP are switched together. When PDP and NDN are closed (and thus PDN and NDP are open), the voltage at PADP rises and the voltage at PADN falls. Conversely when switches PDP and NDN are open and switches PDN and NDP are closed the voltage at PADP falls and the voltage at PADN rises. A second current source 530 connects the LVDS driver to ground 540. This second current source helps maintain the VCM in the above-specified range by providing resistance in the path to ground, and furthermore helps to reject ground noise. LVDS driver 500 further comprises slew control circuitry 550 which is switched in dependence upon the signals steering switches PDP and PDN to establish a current discharge path for current source 520 during a polarity transition of the differential input signal which itself generates the signals for switches PDP, NDN, PDN and NDP. Note that here too, the signal which controls the switch PDP is referred to as 'the PDP signal' or 'the signal PDP' (and similarly for PDN, NDP, and NDN respectively).

Figure 6:
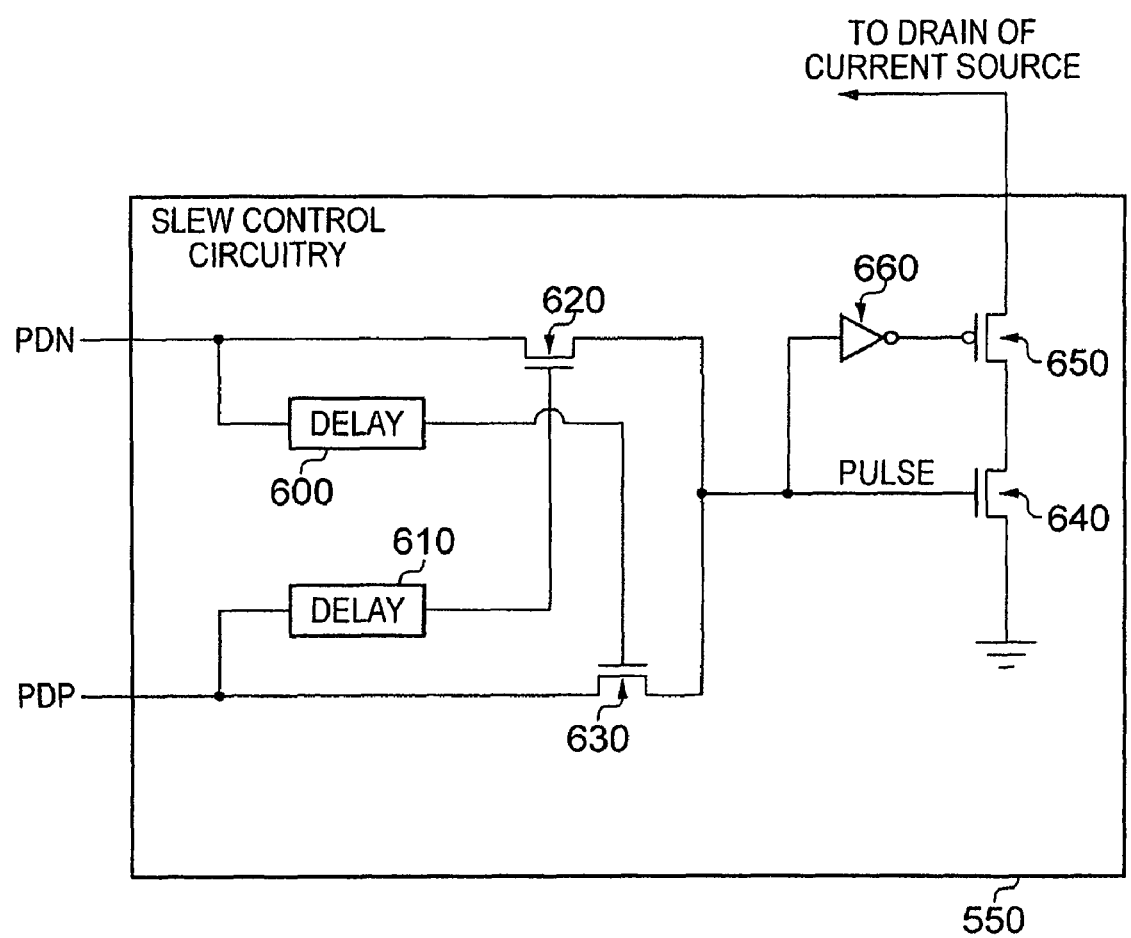
FIG. 6 schematically illustrates a slew control circuit according to one embodiment of the present invention.

FIG. 6 schematically illustrates the slew control circuitry 550 of FIG. 5 in more detail. Slew control circuitry 550 comprises delay units 600 and 610. In this embodiment these are provided by buffers. Slew control circuitry 550 further comprises switches 620 and 630, which in this embodiment are provided by transistors. Switch 620 selectively passes the signal PDN in dependence on the output of delay unit 610, whilst switch 630 selectively passes the signal PDP in dependence on the output of delay unit 600. The combined output of switches 620 and 630 results in the signal PULSE. The signal PULSE is input to the gate of NMOS transistor 640, whilst an inverted version of signal PULSE (converted by means of inverter 660) is input to the gate of PMOS transistor 650. Together PMOS transistor 650 and NMOS transistor 640 thus provide a selective current discharge path for the current source. The current discharge path connects (not illustrated) to the drain of current source (PMOS transistor) 520 in FIG. 5.

Figure 7:
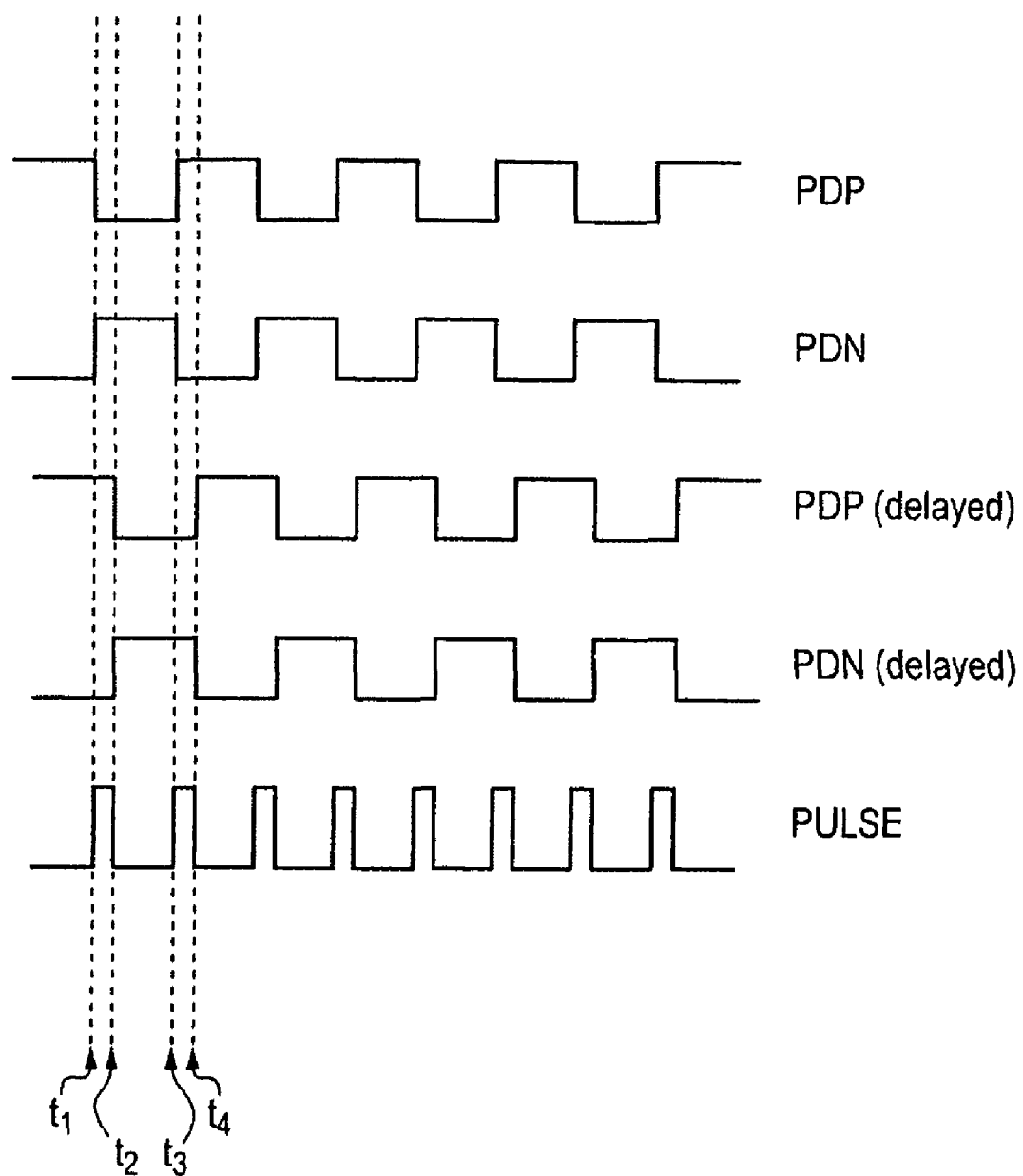
FIG. 7 schematically illustrates the relative timings of various signals in one embodiment of the present invention.

FIG. 7 schematically illustrates the relative timings of the signals PDN and PDP (and their delayed counterparts), as well as the generated signal PULSE in FIG. 6. Signals PDP and PDN can be seen to be the inverse of one another. PDP (delayed) can be seen to be a delayed version of the signal PDP, delayed by a small proportion of the cycle time of signal PDP. Similarly signal PDN (delayed) can be seen to be a delayed version of the signal PDN, delayed by the same small proportion of the cycle time of signal PDN.

Hence, it can be seen that the delayed version of PDP issued by delay unit 610 in FIG. 6, controlling the gate of transistor 620, will result in a high level signal being output from transistor 620 in the period between signal PDN going high at time $t_1$ and signal PDP (delayed) going low at time $t_2$.

Similarly, it can be seen that that the delayed version of PDN issued by delay unit 600 in FIG. 6, controlling the gate of transistor 630, will result in a high level signal being output from transistor 630 in the period between signal PDP going high at time $t_3$ and signal PDN (delayed) going low at time $t_4$.

Thus, a first pulse signal is generated from signal PDN and a delayed version of signal PDP, whilst a second pulse signal is generated from PDP and a delayed version of signal PDN. The final signal PULSE is generated by interleaving the first pulse signal and the second pulse signal. Returning to FIG. 6, the signal PULSE and its inverted version (generated by inverter 660) thus control NMOS transistor 640 and PMOS transistor 650 to establish a current discharge path between the drain of the current source and ground in a short period immediately following a polarity transition of either signal PDP or of signal PDN.

Figure 8:
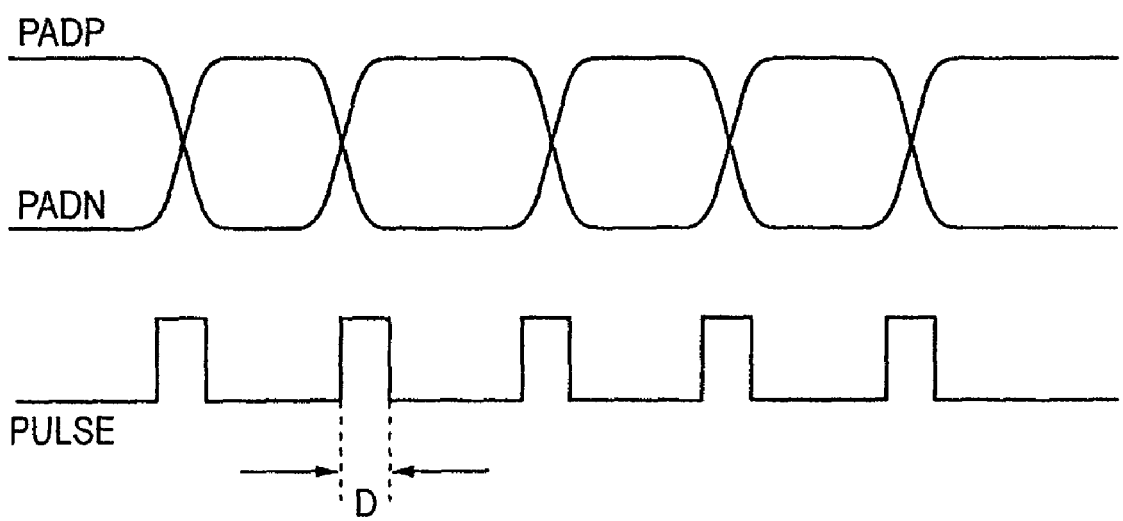
FIG. 8 schematically illustrates a symmetric slew rate resulting from one embodiment of the present invention.

Turning to FIG. 8, it can be seen how the PULSE signal, by selection of an appropriate delay created by delay units 600 and 610, results in a pulse which begins when either one of the output nodes (pads) PADP or PADN is experiencing a charging polarity transition, the duration D of the signal PULSE being selected such that the current discharge path for the current source is established for an appropriate period to restore the symmetry of the slew rate. The duration D of the signal PULSE is typically about 150 ps.

Figure 1:
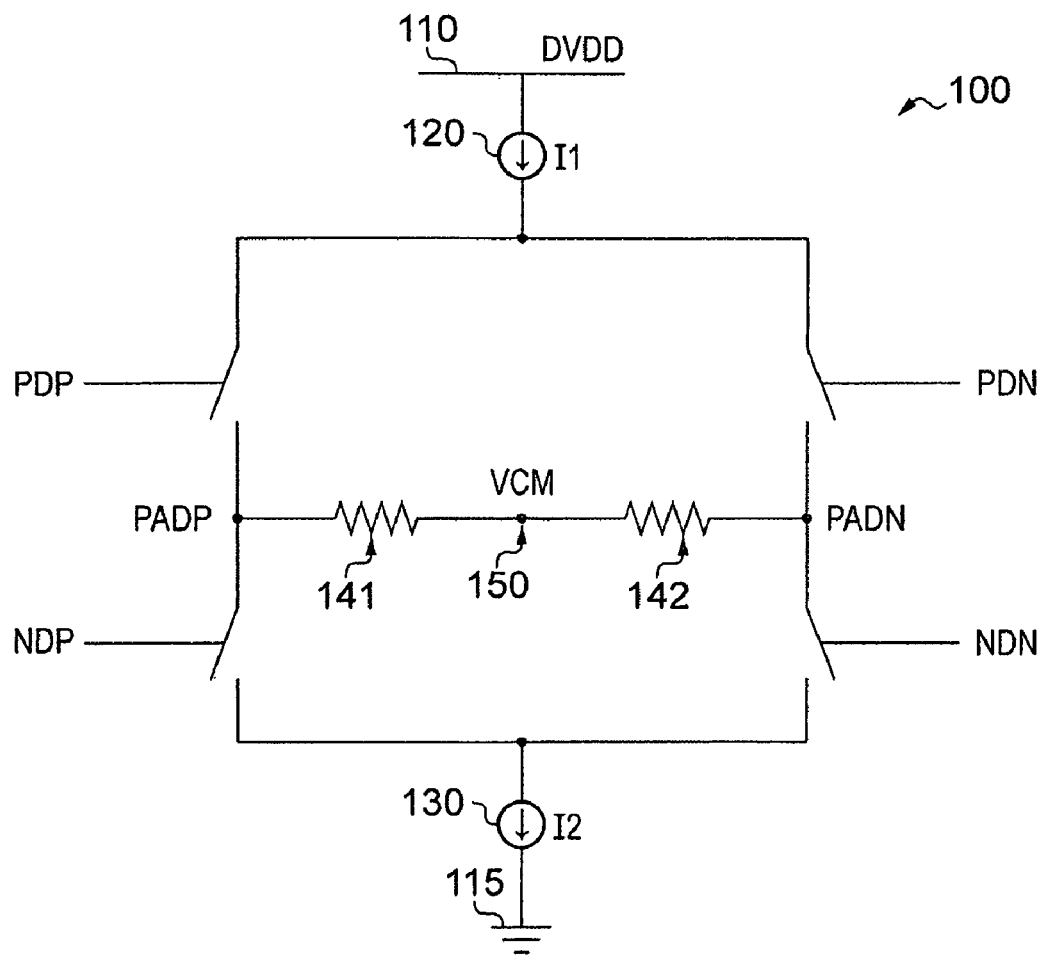
FIG. 1 schematically illustrates a prior art LVDS driver.
Figure 2:
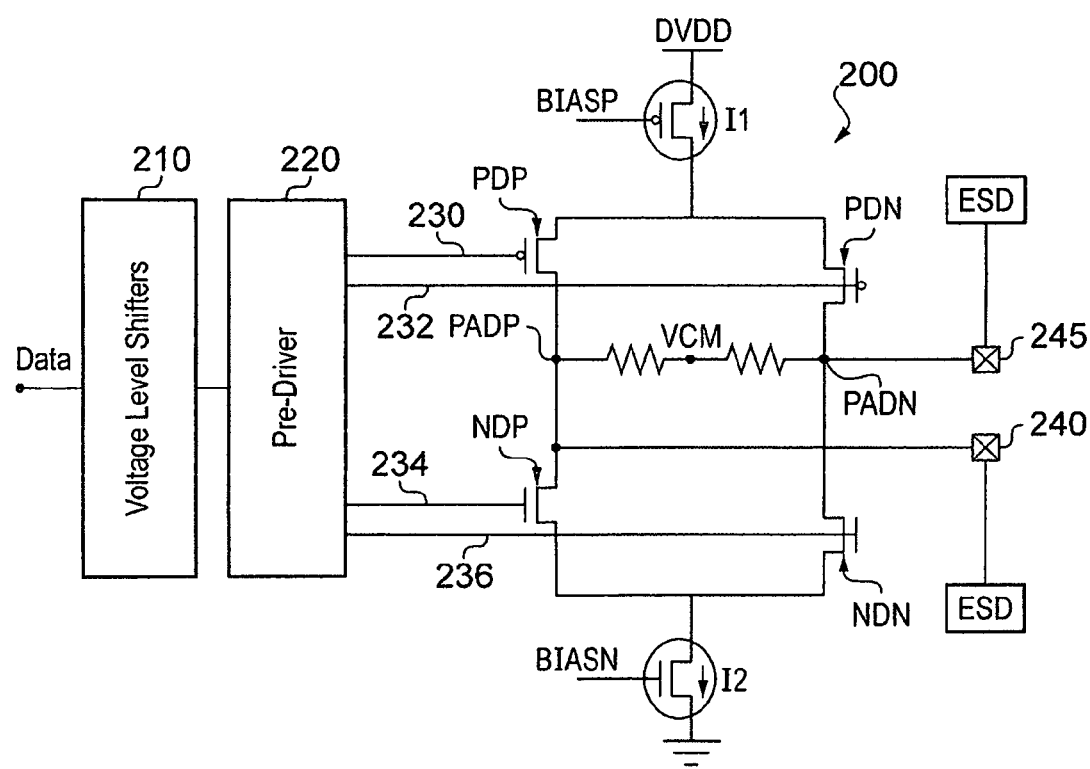
FIG. 2 schematically illustrates a prior LVDS driver system.
Figure 3:
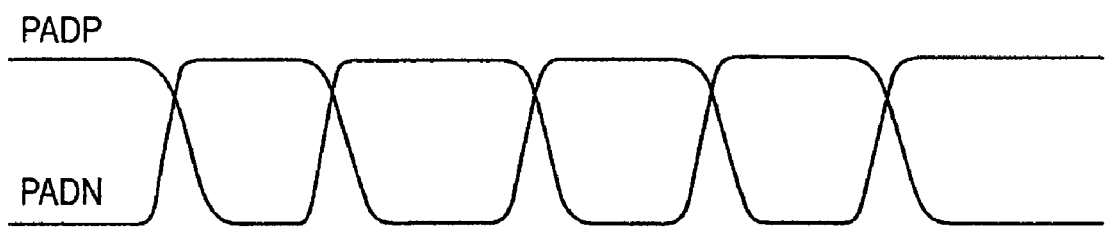
FIG. 3 schematically illustrates an asymmetric slew rate.
Figure 4:
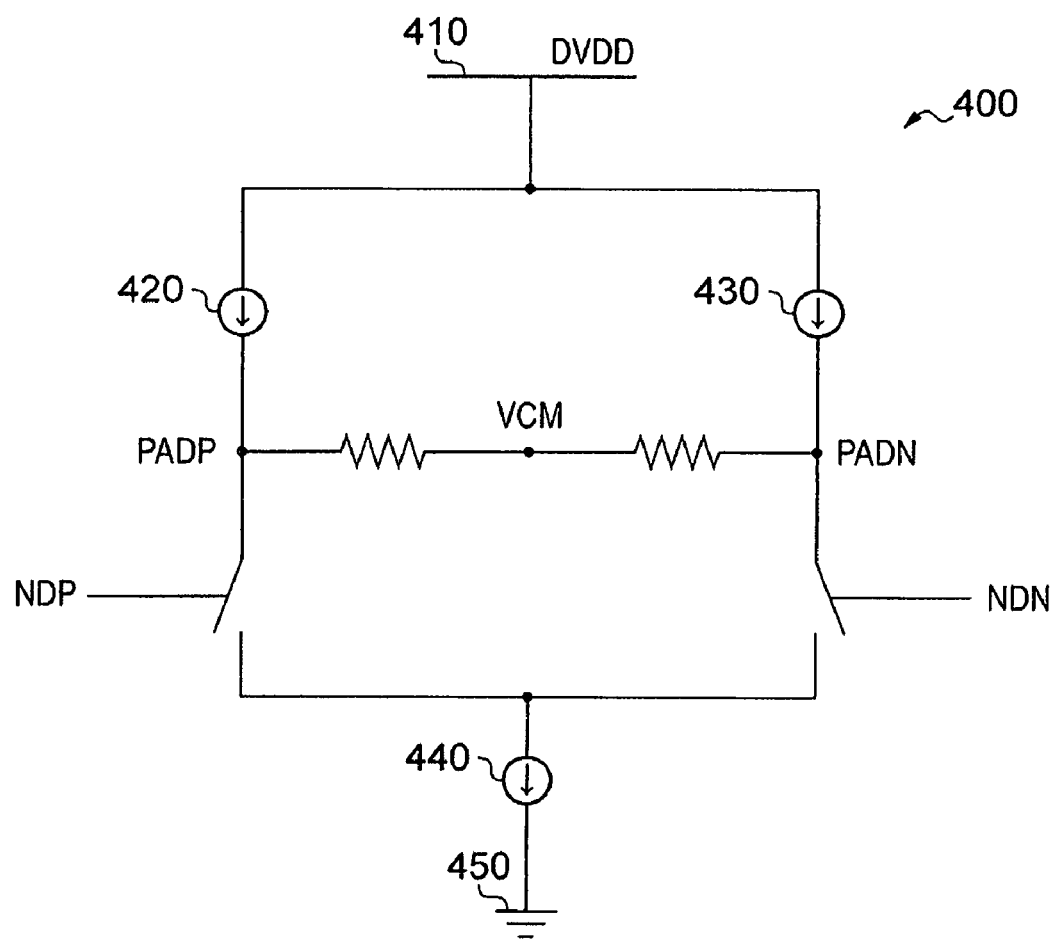
FIG. 4 schematically illustrates a prior art LVDS driver with parallel current sources on the voltage supply side.
Figure 9A:
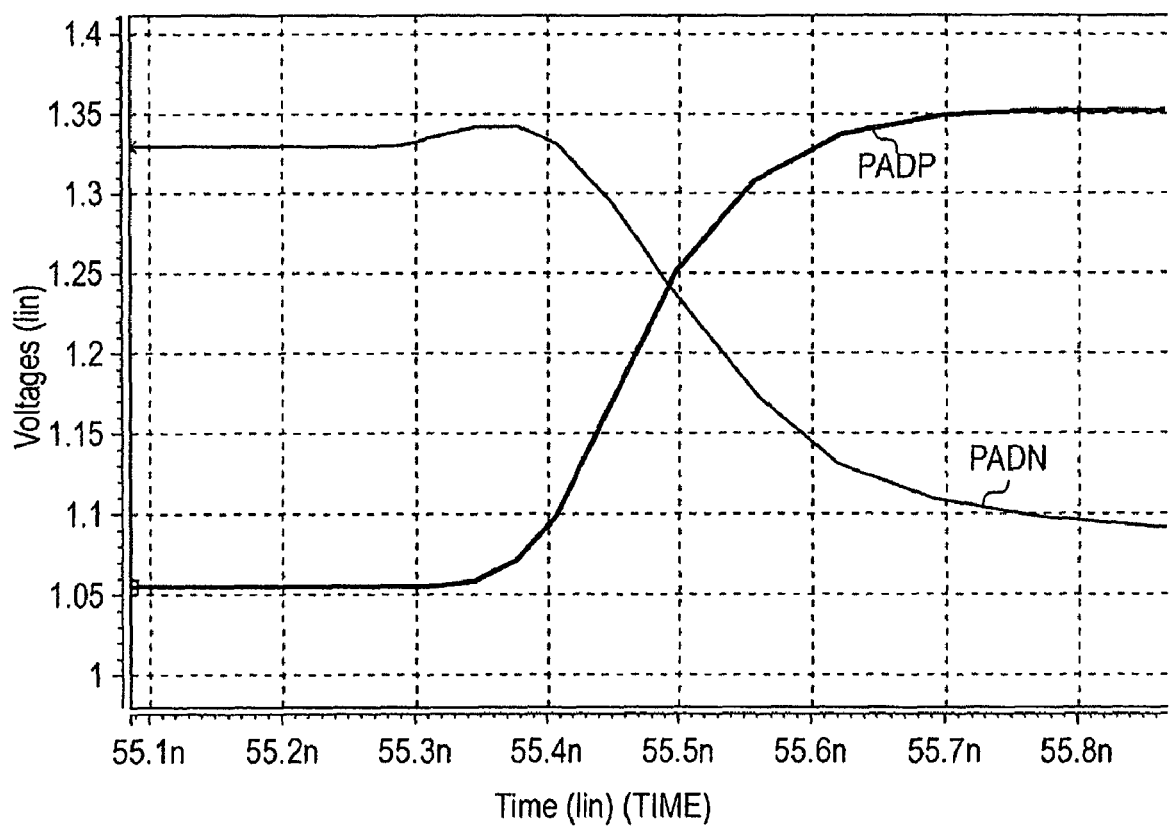
FIG. 9A illustrates a tested asymmetric slew rate.
Figure 9B:
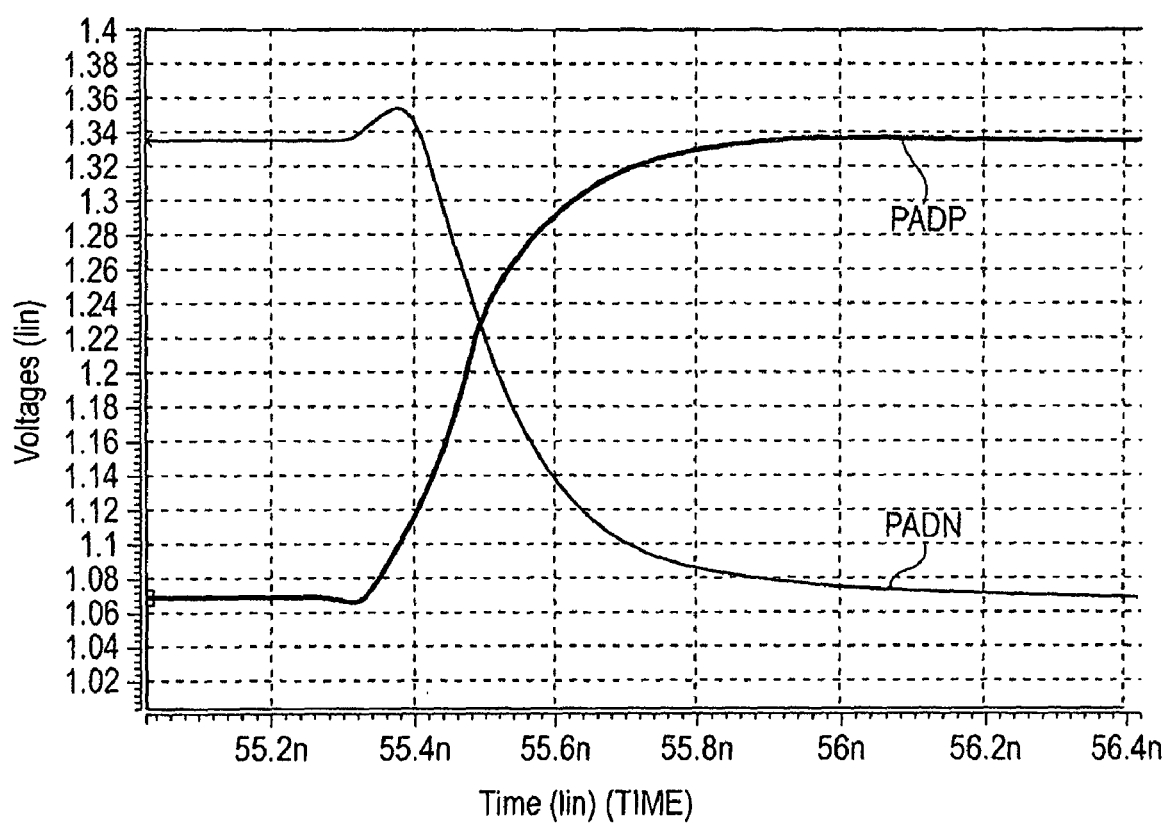
FIG. 9B illustrates a tested symmetric slew rate.

Finally, turning to FIGS. 9A and 9B, the results of an implementation of the present invention are illustrated. FIG. 9A illustrates the time evolution of signals PADP and PADN in a LVDS driver such as that shown in FIG. 1 and clearly shows an asymmetric slew rate. Note that the intersection of the gradients of each curve is noticeably above the halfway point between the two signals, i.e. the rise slew rate is faster than the fall slew rate. Turning to FIG. 9B, the beneficial effect of the slew control circuitry of the present invention can be seen—note that the intersection of the gradients in this case falls at the mid point between the signals PADP and PADN.

Thus the present invention provides a LVDS driver which may be operated at lower than conventional voltages, without suffering from an asymmetric slew rate. The LVDS driver has a first output node and a second output node which provide a differential signal. First differential steering switch circuitry is switched in dependence on a differential input signal to selectively connect the first output node to a voltage supply via a current source, whilst second differential steering circuitry is switched in dependence on an inverse version of the differential input signal to connect the second output node to the voltage supply via the current source. Slew control circuitry is provided, configured to establish a current discharge path for the current source during the polarity transition of the differential input signal, thus maintaining a symmetric slew rate of the output signals at the first output node and second output node.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:

1. A low voltage differential signalling driver comprising:
   a current source, said current source being connected to a voltage supply;
   a first output node and a second output node for providing a differential signal by virtue of a difference between a first voltage of said first output node and a second voltage of said second output node;
   first differential steering switch circuitry configured to be switched in dependence on a differential input signal to selectively connect said current source to said first output node to cause said first voltage to rise with respect to said second voltage;
   second differential steering switch circuitry configured to be switched in dependence on an inverse version of said differential input signal to selectively connect said current source to said second output node to cause said second voltage to rise with respect to said first voltage; and
   slew control circuitry configured to establish a current discharge path for said current source during a polarity transition of said differential input signal, thereby reducing a slew rate of one of said first and second voltages that is rising with respect to the other of said first and second voltages.

2. A low voltage differential signalling driver as claimed in claim 1, wherein said slew control circuitry is configured to establish said current discharge path for said current source by connecting said current source to ground.

3. A low voltage differential signalling driver as claimed in claim 1, wherein said first differential steering switch circuitry further selectively connects said second output node to a reference voltage to cause said second voltage to fall whilst said first voltage is rising, and said second differential steering switch circuitry selectively connects said first output node to said reference voltage to cause said first voltage to fall whilst said second voltage is rising.

4. A low voltage differential signalling driver as claimed in claim 3, wherein said reference voltage is ground.

5. A low voltage differential signalling driver as claimed in claim 1, further comprising a further current source, said further current source connecting said first output node and said second output node to ground.

6. A low voltage differential signalling driver as claimed in claim 1, wherein said slew control circuitry is configured to establish said current discharge path in dependence on a pulsed signal.

7. A low voltage differential signalling driver as claimed in claim 6, wherein said pulsed signal is generated from said differential input signal.

8. A low voltage differential signalling driver as claimed in claim 7,
   wherein a first pulse signal is generated from an inverse version of said differential input signal and a delayed version of said differential input signal,
   a second pulse signal is generated from said differential input signal and a delayed version of said inverse version of said differential input signal,
   and said pulsed signal is generated by interleaving said first pulse signal and said second pulse signal.

9. A low voltage differential signalling driver as claimed in claim 8, wherein said delayed version of said differential input signal is generated by buffering said differential input signal, and said delayed version of said inverse version of said differential input signal is generated by buffering said inverse version of said differential input signal.

10. A low voltage differential signalling driver as claimed in claim 6, wherein said slew control circuitry comprises an NMOS transistor switched by said pulsed signal to selectively establish said current discharge path.

11. A low voltage differential signalling driver as claimed in claim 10, wherein said slew control circuitry further comprises a PMOS transistor switched by an inverse version of said pulsed signal.

12. A method of providing a low voltage differential signal comprising the steps of:
   providing a current source connected to a voltage supply;
   providing a first output node and a second output node, said first output node and said second output node being for providing a differential signal by virtue of a difference between a first voltage of said first output node and a second voltage of said second output node;
   connecting said current source to said first output node in dependence on a differential input signal to cause said first voltage to rise with respect to said second voltage;
   connecting said current source to said second output node in dependence on an inverse version of said differential input signal to cause said second voltage to rise with respect to said first voltage; and
   establishing with slew control circuitry, during a polarity transition of said differential input signal, a current discharge path for said current source thereby reducing a slew rate of one of said first and second voltages that is rising with respect to the other of said first and second voltages.

13. A low voltage differential signalling driver comprising:
   a current source means, said current source means being connected to a voltage supply;
   a first output node means and a second output node means for providing a differential signal by virtue of a difference between a first voltage of said first output node means and a second voltage of said second output node means;
   first differential steering switch means configured to be switched in dependence on a differential input signal to selectively connect said current source means to said first output node means to cause said first voltage to rise with respect to said second voltage;
   second differential steering switch means configured to be switched in dependence on an inverse version of said differential input signal to selectively connect said current source means to said second output node to cause said second voltage to rise with respect to said first voltage; and slew control means for establishing a current discharge path for said current source means during a polarity transition of said differential input signal, thereby reducing a slew rate of one of said first and second voltages that is rising with respect to the other of said first and second voltages.

14. A low voltage differential signalling driver comprising:
a current source, said current source being connected to a voltage supply;
a first output node and a second output node for providing a differential signal by virtue of a difference between a first voltage of said first output node and a second voltage of said second output node;
first differential steering switch circuitry configured to be switched in dependence on a differential input signal to selectively connect said current source to said first output node to cause said first voltage to rise with respect to said second voltage;
second differential steering switch circuitry configured to be switched in dependence on an inverse version of said differential input signal to selectively connect said current source to said second output node to cause said second voltage to rise with respect to said first voltage; and
slew control circuitry configured to establish a current discharge path for said current source during a polarity transition of said differential input signal, wherein said first differential steering switch circuitry further selectively connects said second output node to a reference voltage to cause said second voltage to fall whilst said first voltage is rising, and said second differential steering switch circuitry selectively connects said first output node to said reference voltage to cause said first voltage to fall whilst said second voltage is rising.

15. A low voltage differential signalling driver as claimed in claim 14, wherein said reference voltage is ground.

* * * * *